United States Patent [19]
Braginetz

[11] 4,329,008
[45] May 11, 1982

[54] HIGH DENSITY CONNECTOR MODULE WITH TRI-PADDLE CONTACT ELEMENTS
[76] Inventor: Paul A. Braginetz, 214 Oak Ridge Cir., Staunton, Va. 24401
[21] Appl. No.: 136,288
[22] Filed: Apr. 1, 1980
[51] Int. Cl.³ .............................................. H01R 9/09
[52] U.S. Cl. .............................. 339/217 S; 339/17 LC
[58] Field of Search ..... 339/217 S, 217 ML, 217 LC, 339/256 R

[56] References Cited
U.S. PATENT DOCUMENTS 3,493,916  2/1970  Hansen ........................... 339/17 LC
3,641,483  2/1972  Bonhomme ...................... 339/217 S
4,060,295  11/1977  Tomkiewicz ................... 339/17 LC Primary Examiner—Eugene F. Desmond
Attorney, Agent, or Firm—B. P. Fishburne, Jr.

[57] ABSTRACT

A high density connector module which may form part of a receiver having a plurality of similar modules is structured in its rows of passages to receive lockingly a like number of tri-paddle contacts, which in turn are capable of receiving sessile conductors including spring clips for anchoring them to an individual test adapter or panel. The tri-paddle contacts at their ends away from the individual test adapter are connected through wire-wrapped posts to a printed circuit board held by fasteners against a seating surface and within a registration notch of the high density module.

1 Claim, 9 Drawing Figures

U.S. Patent   May 11, 1982   Sheet 1 of 2   4,329,008
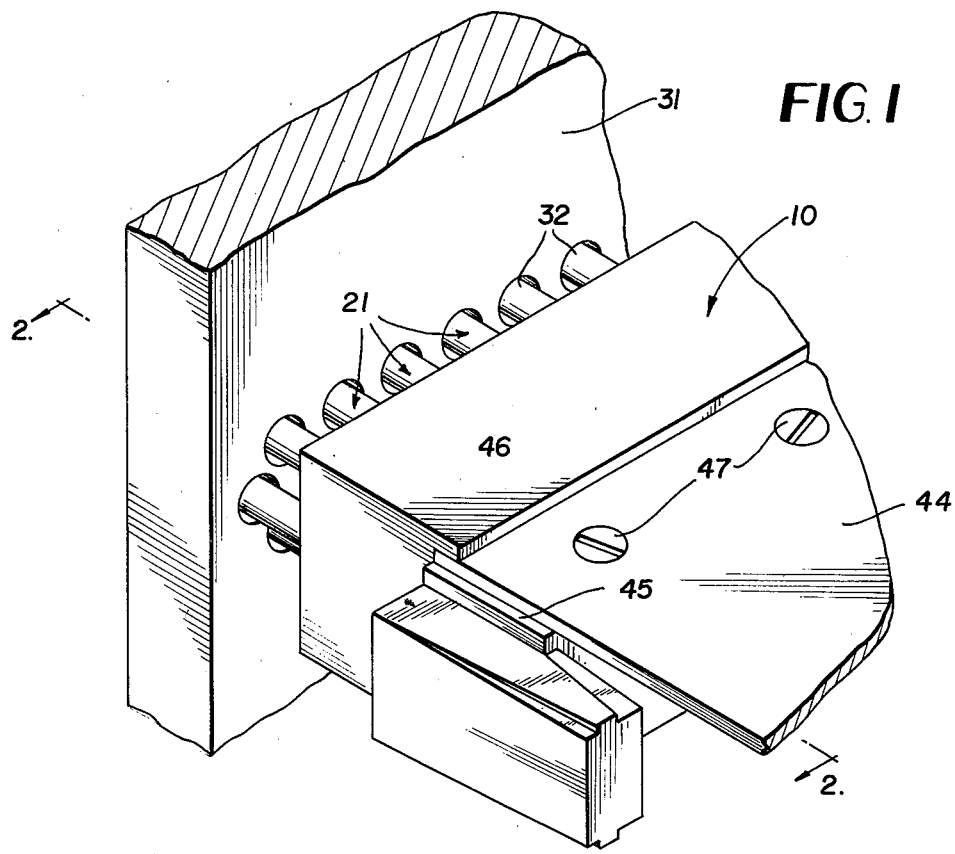
FIG. 1
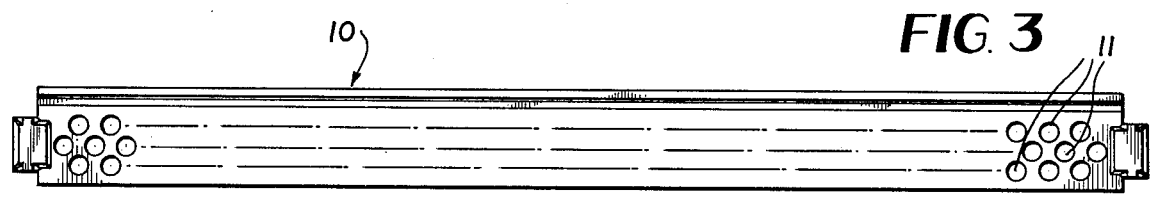
FIG. 3
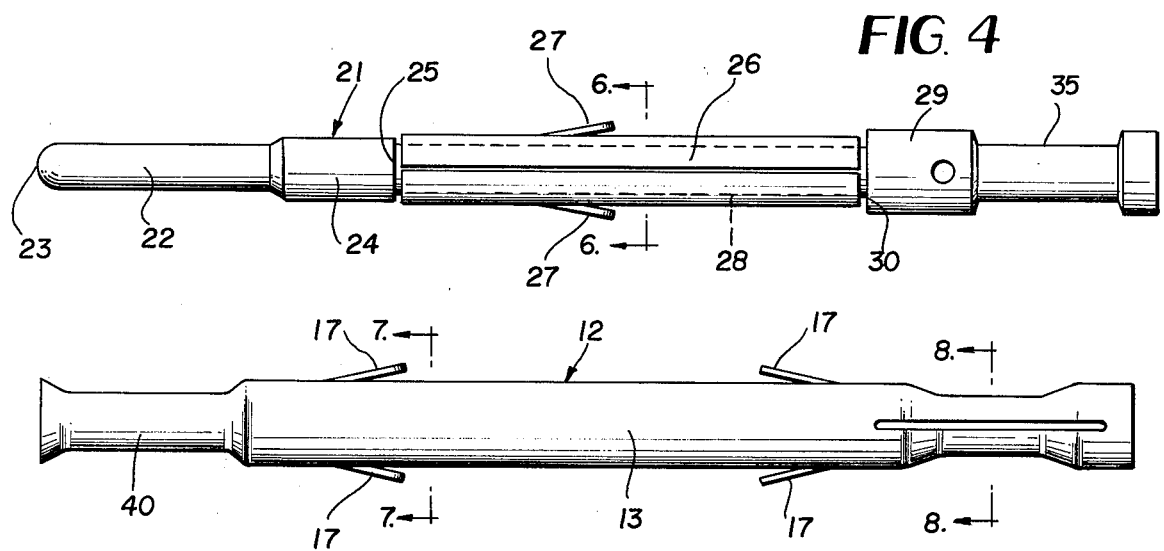
FIG. 4
FIG. 5

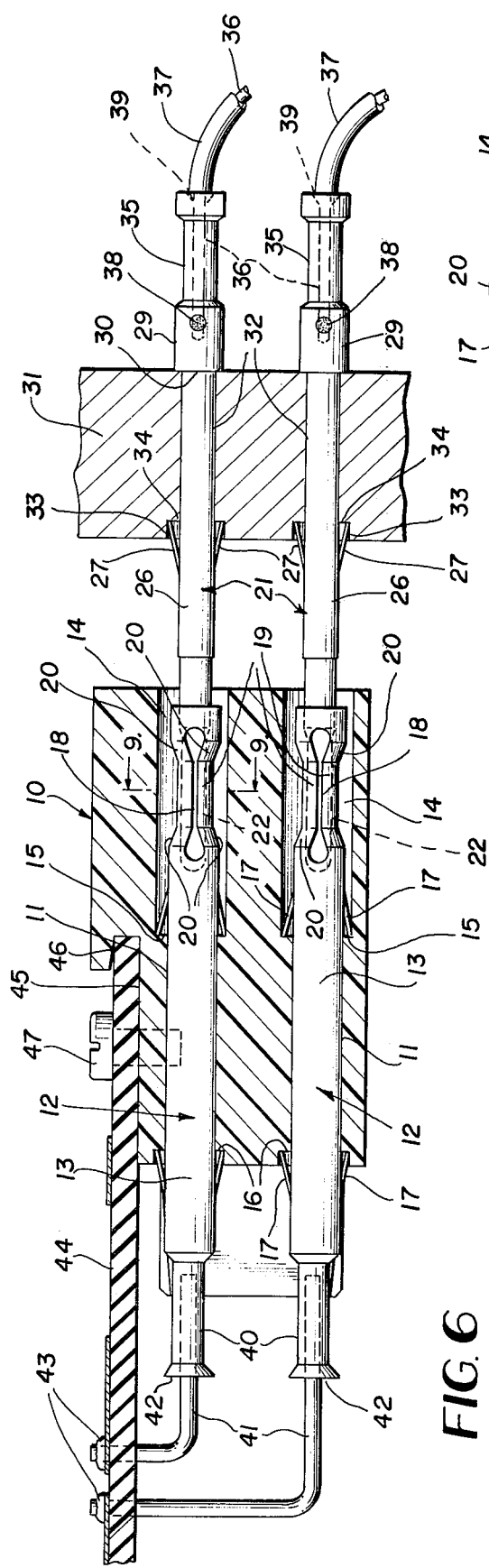
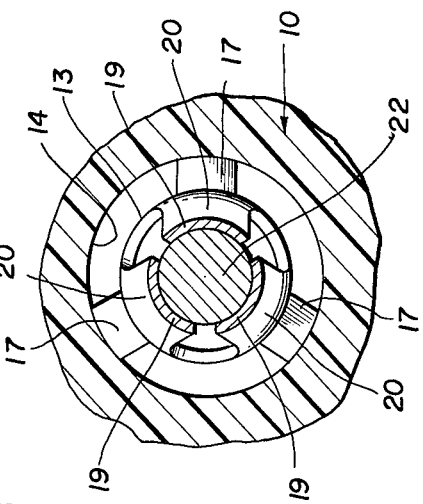
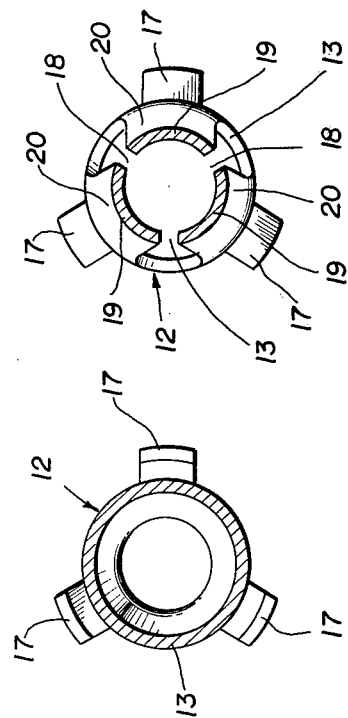
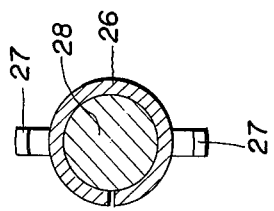

HIGH DENSITY CONNECTOR MODULE WITH TRI-PADDLE CONTACT ELEMENTS

BACKGROUND OF THE INVENTION

The present invention relates to that specialized class of electrical connectors which has evolved with the development of computer interface equipment. As such equipment becomes more complex and sophisticated, there is a constant demand for more efficient and convenient connector arrangements for the multitudes of connections which must be established between components such as individual test adapters and coacting receivers. The connector structures must be reasonably sturdy and durable to allow repetitive coupling and separation of mating contacts without damage, and there is a constant need to minimize manufacturing costs while maintaining high quality in the connector system. Convenience of use including ease of assembling and disassembling of components is also a high requirement of the art.

The present invention seeks to satisfy all of these needs to the greatest possible extent while at the same time providing a connector module having the highest possible density of electrical connections through mating contacts arranged in multiple rows which interfit to provide the greatest number of connections in a given area along the individual module and in a receiver made up from a plurality of high density modules.

Other objects and advantages of the invention will become apparent during the course of the following detailed description.

BRIEF DESCRIPTION OF THE DRAWINGS

FIG. 1 is a fragmentary perspective view of the invention according to a practical embodiment thereof.

FIG. 2 is a fragmentary vertical section taken on line 2—2 of FIG. 1.

FIG. 3 is a side elevation of a high density connector module employed in the invention.

FIG. 4 is a side elevation of a sessile conductor assembly.

FIG. 5 is a similar side elevation of a tri-paddle spring contact used in association with the high density module.

FIG. 6 is an enlarged transverse vertical section taken on line 6—6 of FIG. 4.

FIG. 7 is a similar view taken on line 7—7 of FIG. 5.

FIG. 8 is a similar view taken on line 8—8 of FIG. 5.

FIG. 9 is a similar view taken on line 9—9 of FIG. 2.

DETAILED DESCRIPTION

Referring to the drawings in detail wherein like numerals designate like parts, the numeral 10 designates a high density module for a receiver or the like formed as a unit from a suitable dielectric material. The high density module 10 can be one of several such modules in a receiver of the type employed in computer interface equipment. The module 10 is an elongated bar-like member as depicted in FIG. 3. To achieve the high density or concentration of electrical contacts within the module 10, the receiver is provided with closely interfitting or nesting rows of contact passages 11. This arrangement packs the greatest number of contact passages within a given area along the module 10. The length of the module and thus the number of contact passages in the rows may vary, and the width of the module and the number of parallel rows of nesting passages 11 may vary in the invention. In the embodiment illustrated, the bar-like module 10 contains three rows of the passages 11 with the two outer rows containing thirty-three equidistantly spaced passages 11 and the intermediate row containing thirty-four passages, also equidistantly spaced along the module 10 but also staggered longitudinally of the outer row of passages 11 and falling midway between the outer row of passages to provide the maximum possible density of passages in accordance with a prime feature of the invention. By virtue of this arrangement, up to one hundred contacts constructed in accordance with another important feature of the invention can be placed in assembled relationship with each module 10 on a receiver frame or like equipment.

Each passage 11 of the module 10 receives a prefabricated metallic tri-paddle spring contact element 12 therein, which element forms a very important aspect of this invention. FIG. 12 shows the contact elements 12 for the two outer rows of passages 11 in FIG. 3. The contact 12 for the intermediate row does not appear in FIG. 2 because such contact does not lie in the plane on which the cross section was taken for drawing FIG. 2.

Each spring contact 12 comprises an elongated cylindrical sleeve body 13 having a large bearing area of contact with the wall of the cylindrical passage 11 for stability. Each passage 11 includes an enlarged cylindrical entrance portion 14, the inner end of which defines an annular square shoulder 15. At the far side of the module 10, shallow recesses form additional annular shoulders 16 in axially spaced opposing relationship to the shoulders 15. Projecting spring tabs 17 on the sleeve body 13 near opposite ends thereof diverge in opposite directions with respect to the longitudinal axis of the passage 11. Thus, when each contact element 12 is pushed through the passage 11, one set of spring tabs 17 will yield inwardly to allow movement through the passage 11 and then will snap outwardly into permanent locking engagement with the shoulder 15 or 16 to preclude longitudinal displacement in one direction of the contact element 12 relative to module 10. The other set of spring locking tabs 17 similarly engage the other shoulder 15 or 16 and the contact element 12 is securely held against axial displacement on the module 10.

Within the enlarged portion 14 of each passage 11, a reduced diameter section of the sleeve body 13 is longitudinally slotted at 18, preferably at three circumferentially equidistantly spaced locations. This produces three arcuate contact paddles 19 on each contact element 12 which are individually connected to the sleeve body 13 through inclined flexure portions 20 which bend and provide independent spring action for the three paddles 19 when a coacting male contact element is inserted into the end of the contact element 12 having the spring paddles 19. The slots 18 extend through the inclined portions 20 as shown in the drawings. The arcuate paddles 19 are of considerable length and cylindrically formed between the flexure portions 20 so that they can collectively exert a very snug gripping force on a male contact inserted through them.

The coacting male contacts may, for example, be sessile conductor assemblies 21, one for each tri-paddle spring contact 12. Each sessile conductor assembly 21 includes a leading end solid cylindrical male contact pin 22 having a spherically rounded end 23. A somewhat enlarged cylindrical portion 24 is formed rearwardly of pin 22 to form a locator shoulder 25 for a longitudinally split spring locking clip 26 having a pair of diametrically opposed outwardly projecting inclined spring locking tabs 27. As shown in FIG. 6, the clip 26 embraces the central stem or pin portion 28 of the male conductor which may have the same diameter as the contact pin 22. A rearward enlargement 29 on each sessile conductor assembly 21 defines a second locator shoulder 30 for the clip 26 so that the clip will be held against axial movement relative to the pin body of the male conductor assembly or contact.

As best shown in FIGS. 1 and 2, an individual test adapter 31, or a panel, has receptor openings 32 formed therethrough, and recesses 33 in one face of the panel define locking shoulders 34 for the spring locking tabs 27, FIG. 2, to prevent displacement of the clip 26 relative to the panel 31 in one direction. The shoulder 30 bearing on the other face of the panel 31 locks the clip 26 against displacement in the other direction, and thus the spring clip 26 is enabled to firmly hold the sessile conductor assembly in assembled relationship with the panel 31 with the male contact pin 22 extending well forwardly of the panel 31 or individual test adapter. The cylindrical openings 32 afford a large bearing surface area for the retainer or mounting clip 26 so that the clips provide a very stable support or connection between the contact pins 22 and the panel 31. FIG. 2 also shows the male contact pins 22 in dotted lines engaged with the arcuate spring paddles 19 of the female contacts 12. The illustrated connections are identical along the full length of the module 10 having the described rows of contact passages 11.

The rear extensions 29 are crimped as at 35 into firm electrical engagement with wires 36 having suitable insulation 37. Such wires may be soldered to the sessile conductor assemblies at 38 and 39. Similarly, forward extensions 40 of tri-paddle spring contacts 12 are crimped on wire-wrapped posts 41 and soldered at 42 to these posts. Right angular extensions of the posts 41 are solder-connected at 43 to a printed circuit board 44 which engages a seating surface 45 on the connector module 10 and also has one edge in registration with a locator notch 46 provided longitudinally of the module 10. Screws 47 serve to secure the printed circuit board 44 to the module 10 as shown in FIGS. 1 and 2.

It may now be understood by those skilled in the art that a high density electrical connector for computer interface equipment and the like is provided by the invention including a high density insulating module in secure assembled relationship with the largest possible number of unique tri-paddle spring contact elements which are very stably mounted on the module. The module equipped with the tri-paddle spring contact elements affords the possibility of direct and efficient electrical connections with an almost unlimited number of coacting components such as printed circuit boards and individual test adapters equipped with male contacts capable of being engaged with the tri-paddle spring contacts on the module. In the invention, the tri-paddle spring contacts are locked securely and immovably on the module by the action of the integral spring tabs 17 and without the necessity for any additional fastening means. The structures involved in the invention are durable, highly compact, very convenient to use, and both mechanically and electrically efficient. They promote long product life and satisfy the previously-stated needs of the art.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. A high density electrical connector structure particularly for computer interface equipment and the like, said connector structure comprising an individual test adapter panel, said panel having plural parallel rows of through openings, the through openings of adjacent rows being staggered to provide a higher density of connections through the panel, a multiplicity of male sessile conductors anchored within said through openings and having rear ends thereof projecting beyond one face of said panel and adapted for connection with sessile cables, the sessile conductors having male contact pins at their other corresponding ends extending forwardly of the other face of said panel, and a coacting receiver comprising at least one elongated bar-like high density conductor module having in one face thereof plural parallel longitudinal rows of recesses with the recesses in each row staggered relative to those of adjacent rows so as to correspond in spacing to the through openings of said panel and the spacing of said male contact pins, the high density conductor module having passages of reduced cross sectional size extending from the bottoms of said recesses through the other face of said module remote from said panel, a corresponding number of tri-paddle tubular spring contacts in said recesses and passages extending from said recesses and projecting forwardly of said other face of the high density connector module, axially spaced oppositely acting spring clips on the tri-paddle tubular spring contacts lockingly engaged with the bottoms of the recesses and with said module near said other face thereof to prevent axial movement of the tri-paddle tubular spring contacts relative to said module, the tri-paddles of such contacts receiving snugly said male contact pins of the sessile conductors within said recesses of high density conductor module, such module being provided on its top face with a flat locator surface for a printed circuit board and being further provided with a locator groove for said board at the rear of the locator surface and near the front-to-back center of the module, said locator surface and groove extending for the entire length of said module and the locator surface being in a plane parallel to the axes of said tri-paddle tubular spring contacts and said groove extending across such axes, a printed circuit board having printed circuit elements on its top face seated on said locator surface and having one edge portion engaged in said locator groove, screws anchoring printed circuit boards firmly to the locator surface with said boards projecting substantially forwardly of said module in overhanging relationship to the front face thereof, and substantially L-shaped wire-wrapped posts electrically interconnecting said printed circuit elements with forward terminals of the tri-paddle tubular spring contacts beneath said printed circuit board and forwardly of said module.

* * * * *